(12) United States Patent
Cheng et al.

(10) Patent No.: US 10,198,544 B2
(45) Date of Patent: Feb. 5, 2019

(54) METHOD FOR IMPROVING OPENCL HARDWARE EXECUTION EFFICIENCY

(71) Applicant: Hangzhou Flyslice Technologies Co., Ltd., Hangzhou (CN)

(72) Inventors: Ailian Cheng, Hangzhou (CN); Wenhua Wang, Hangzhou (CN)

(73) Assignee: HANGZHOU FLYSLICE TECHNOLOGIES CO., LTD., Hangzhou (CN)

( * ) Notice: Subject to any disclaimer, the term of this patent is extended or adjusted under 35 U.S.C. 154(b) by 28 days.

(21) Appl. No.: 15/462,780

(22) Filed: Mar. 17, 2017

(65) Prior Publication Data

US 2018/0011957 A1    Jan. 11, 2018

(30) Foreign Application Priority Data

Jan. 20, 2016 (CN) .......................... 2016 1 0039665

(51) Int. Cl.
*G06F 17/50* (2006.01)

(52) U.S. Cl.
CPC ........ *G06F 17/5054* (2013.01); *G06F 17/505* (2013.01); *G06F 17/5072* (2013.01); *G06F 17/5077* (2013.01)

(58) Field of Classification Search
CPC ................................................. G06F 17/5054
USPC ...................................................... 716/103
See application file for complete search history.

(56) References Cited

U.S. PATENT DOCUMENTS

| | | | | |
|---|---|---|---|---|
| 8,918,748 | B1* | 12/2014 | Chiu | G06F 17/5054 |
| | | | | 716/102 |
| 2013/0191852 | A1* | 7/2013 | Howes | G06F 9/4843 |
| | | | | 719/318 |
| 2013/0346953 | A1* | 12/2013 | Chen | G06F 8/48 |
| | | | | 717/151 |
| 2014/0351775 | A1* | 11/2014 | Alfieri | G06F 17/5022 |
| | | | | 716/102 |

* cited by examiner

*Primary Examiner* — Suresh Memula
(74) *Attorney, Agent, or Firm* — Perkins Coie LLP

(57) ABSTRACT

A method for improving OpenCL hardware execution efficiency described in this invention comprises the following steps: compiling a kernel implemented in OpenCL, generating Verilog code with a high-level synthesis tool; analyzing the interfaces of auto-generated Verilog code, recording signals, timing sequence, and function of the interfaces; manually modifying and optimizing the Verilog code; inserting a file replacement command in the script responsible for flow control, replacing the auto-generated code with the optimized Verilog code; rerunning OpenCL compiler and generating an ultimate FPGA configuration file. The invention makes manual optimization of the auto-generated Verilog code becomes possible, by parsing the compilation flow of OpenCL environment and analyzing the structure and interfaces of the auto-generated Verilog code. It promotes the performance of kernels, by increasing working frequency, achieving more parallelism and taking full advantages of FPGA hardware resources, and improves the execution efficiency of OpenCL on FPGA platform significantly.

3 Claims, 2 Drawing Sheets

METHOD FOR IMPROVING OPENCL HARDWARE EXECUTION EFFICIENCY

CROSS-REFERENCE TO RELATED APPLICATIONS

This Non-provisional application claims priority under 35 U.S.C. § 119(a) on Patent Application No(s). 201610039665.2 filed in People's Republic of China on Jan. 20, 2016, the entire contents of which are hereby incorporated by reference.

BACKGROUND OF THE INVENTION

Field of the Invention

This invention relates to a method for improving Open Computing Language (OpenCL) hardware execution efficiency, especially referring to a method for implementing cooperation between OpenCL software code and a high-efficient Field-Programmable Gate Array (FPGA) hardware platform.

Description of the Related Art

Open Computing Language (OpenCL) is the first open and copyright royalty-free programming framework that builds a unified programming environment between heterogeneous systems. OpenCL allows users to develop cross-platform programs based on C programming language, targeting CPUs, GPUs, DSPs and FPGAs, etc. It is a programming model for software engineers and a design methodology for system architects. Compatible with ANSIC standard (C99), OpenCL provides parallel computation mechanisms based on task division and data division for various heterogeneous platforms. The host program communicates with each heterogeneous platform through the Application Program Interface (API) to ensure that the task scheduling is accomplished efficiently and evenly.

For example, developed by Altera Company, the tool Altera SDK for OpenCL (AOCL) is a programming development environment for Field-Programmable Gate Array (FPGA) hardware platforms. The AOCL tool provides an OpenCL compiler and a high-level synthesis technology to convert OpenCL code to Verilog. It directly maps the high-level OpenCL code to FPGA platforms, and the workload of FPGA hardware coding can be reduced.

An OpenCL program is divided into two parts in AOCL environment, one part executed on the host and the other implemented in the hardware platform (i.e., the kernel). The code executed on the host is processed by a standard C compiler, and an executable program is generated in the x86 platform; the code implemented in the hardware platform is processed by the OpenCL compiler, and Verilog code is generated with the help of high-level synthesis technology. Then the physical synthesis tool Quartus II of Altera is called to process the subsequent implementation, placement and routing steps, and generates a downloadable FPGA configuration file. As a reference, FIG. 2 shows the flow diagram of the process above.

The direct mapping from the OpenCL code to the FPGA platforms shortens the time to market and reduces the developing difficulty of design schemes targeted at FPGA hardware platforms, which tremendously facilitates the spread of FPGA utilization among software engineers. In other words, design and programming for FPGA are able to be accomplished without a deep knowledge of FPGA hardware and Verilog. However, the performance of the FPGA platforms is sacrificed, as the Verilog code for FPGA programming is auto-generated by the high-level synthesis tool, which extensively uses templates, unified interfaces and buffers, and lots of FPGA resources have to be reserved for timing closure. Also, as the complexity of functions is increasing, the optimization efficiency of high-level synthesis tool decreases. Further, the more FPGA resources are used, the lower frequency the synthesized design achieves. Therefore, the performance would be unsatisfying low if the OpenCL code is too complex to optimize compared with Verilog design schemes.

There are various methods for improving OpenCL execution efficiency on FPGA hardware platforms, including optimizations in task scheduling, algorithm structures, compiling parameters, and hardware platforms, as described below:

In respect of task scheduling, developers could allocate certain types of accelerating tasks suitable for FPGA, such as logic operations ANDs or ORs, shifting and comparisons, as there are special components to efficiently process these tasks in FPGA hardware; and computational intensive tasks such as multiply-add operations of fixed and floating points can also be accomplished in FPGA as there are abundant DSP components which process data in parallel.

In respect of algorithm structure, developers could take full advantages of the special resources in FPGA, such as internal storage units, embedded peripherals, hardened floating-point DSP blocks, and shifting registers, to design an appropriate structure and data processing flow targeted at FPGA.

In respect of compiling parameters, developers could instruct the compiler by setting appropriate parameters for task scheduling and resource allocations. For example, defined by OpenCL standard, the parameter #pragma unroll is used for loop unrolling, and parameters num_computer_units and num_simd_work_items respectively set the numbers of computing units and parallel work items in the kernel. Currently, most OpenCL compilers for FPGA support these parameters, and with different parameters, the performance may differ significantly.

In respect of hardware platform, developers could choose different platforms according to the characteristics of the accelerating tasks, such as GPU, CPU or FPGA. For example, FPGA devices with huge logic resources and powerful DSP blocks are suitable for computational intensive tasks, while devices with high bandwidth and abundant interfaces are suitable for real-time and stream data processing.

The above methods for improving OpenCL execution efficiency on FPGA hardware platform all work at relatively coarse-grained levels, because users are unable to intervene the implementation of underlying hardware beyond the high-level synthesis tool. Therefore, these methods are limited to the disadvantages of high-level synthesis technology, namely the auto-generated code containing redundancy logic, using lots of buffers, and inferior to hand-coding Verilog code in working frequency and resource utilization. At present, it is impossible to optimize the kernel at the logic level for a specific goal, and the hardware efficiency of FPGA is not being used to its full potential with high-level synthesis tools.

BRIEF SUMMARY OF THE INVENTION

This invention provides a method for improving Open Computing Language (OpenCL) execution efficiency on hardware platforms, thereby making OpenCL code map on a Field-Programmable Gate Array (FPGA) hardware platform with high efficiency and high quality.

In the compilation process, an OpenCL compiler will use high-level synthesis technology to convert OpenCL code to Verilog. The Verilog code generated by different tools varies widely in hierarchical structures and coding styles, but has certain regularity and similarity in respect of interfaces. The kernel needs to utilize standard bus interfaces to visit external storage devices; the code executed on the host configures the kernel and transfers parameters through register read-write operations; and interrupt signals responsible for flow control are further needed between the host and the kernel. For a multi-kernel module, each kernel has a set of the above interfaces.

Based on the above disciplines, a single kernel can be regarded as an optimizing unit. While keeping the signals, timing sequence and function of the interfaces unchanged, modification and optimization of internal code of the kernel will not affect other modules, and the modified code can be seamlessly jointed with the auto-generated code. Manual optimization can be carried out on single or multiple kernels, and benefit the performance of the whole design.

The specific solution is as follows.

A method for improving OpenCL hardware execution efficiency, comprising the following steps:

S1: using a compiler to compile a kernel implemented in OpenCL language, and invoking a high-level synthesis tool to generate Verilog code;

S2: analyzing generated interfaces described in Verilog language, recording signals, timing sequence, and function of the interfaces, and ensuring the above signals, timing sequence, and function remain the same in subsequent steps;

S3: manually optimizing the Verilog code in the kernel according to requirements of performance and resource utilization, and backing up the optimized code to avoid being covered by the subsequent steps;

S4: amending a script responsible for flow control in an OpenCL development environment, inserting a file replacement command after the high-level synthesis step in the compilation process, and replacing the Verilog code auto-generated by the compiler with the optimized Verilog code; and S5: rerunning the OpenCL compilation process from the beginning, the flow control script modified in step S4 taking effect and replacing the Verilog code auto-generated by the OpenCL compiler with the optimized Verilog code in step S3, then the OpenCL development environment automatically invoking a physical synthesis tool to finish the subsequent implementation, placement, and routing steps, and generating an ultimate FPGA configuration file.

In detail, the step of manually optimizing the Verilog code in the kernel may include recognizing parts of the Verilog code possible to be modified and optimized, by parsing the compilation flow of the OpenCL development environment and analyzing the structure and interfaces of the auto-generated Verilog code; and performing targeted modifications, manual optimization, and partial or complete replacement to the Verilog code.

In further detail, the step of amending the script responsible for flow control in the OpenCL development environment may include inserting a monitoring command or the file replacement command into the script; and replacing the Verilog code auto-generated by the compiler with the optimized code after detecting the high-level synthesis step in the compilation process is finished.

The invention has the following beneficial effects:

Compared with prior art, in this invention, through parsing the compilation flow of the OpenCL development environment and analyzing the structure and interfaces of the auto-generated Verilog code, parts of the code possible for manual modification and optimization are identified, and the interface signals and timing sequence of the kernel are recorded. Then targeted optimization could be carried out on the inefficient kernels to improve the performance. The invention preserves the complete OpenCL environment and compilation flows, and provides a method for improving the working efficiency of the kernel, including increasing the working frequency, achieving more functions, and promoting resource utilization through manual optimization. For example, the utilization ratio of DSP blocks in a dedicated FPGA design is able to be more than 80%, while the auto-generated Verilog design is difficult to reach such a high utilization ratio. Therefore, the invention can significantly improve resource utilization and execution efficiency of an OpenCL design targeted at FPGA.

DETAILED DESCRIPTION OF THE INVENTION

Technical solutions of this invention will now be described in detail with reference to the accompanying figures.

In the compilation process, an Open Computing Language (OpenCL) compiler will use high-level synthesis technology to convert OpenCL code to Verilog code. The Verilog code generated by different tools varies widely in hierarchical structures and coding styles, but has certain regularity and similarity in respect of interfaces. For example, in Altera SDK for OpenCL (AOCL) environment, a kernel implemented in OpenCL is possible to have different parameters, however, the Verilog code auto-generated by the compiler mostly has unified interfaces. Besides necessary clock and reset signals, the kernel always uses standard Avalon bus interfaces to communicate with external storage devices such as a DDR and a QDR. Secondly, the kernel has another type of Avalon interfaces for functional control and configurations. The host uses these interfaces to transfer parameters and performs register read-write operations. Thirdly, the interrupt signals responsible for flow control are further needed between the host and the kernel, such as start, end, break flags and so on. For a multi-kernel module, each kernel has a set of the above-mentioned interfaces. Based on the above disciplines, a single kernel module can be regarded as an optimizing unit. While keeping the signals, timing sequence and function of the interfaces unchanged, modification and optimization of internal code of the kernel will not affect other modules, and the modified code can be seamlessly jointed with the auto-generated code. Manual optimization can be carried out on a single or multiple kernels and benefit the performance of the whole design.

Figure 1:
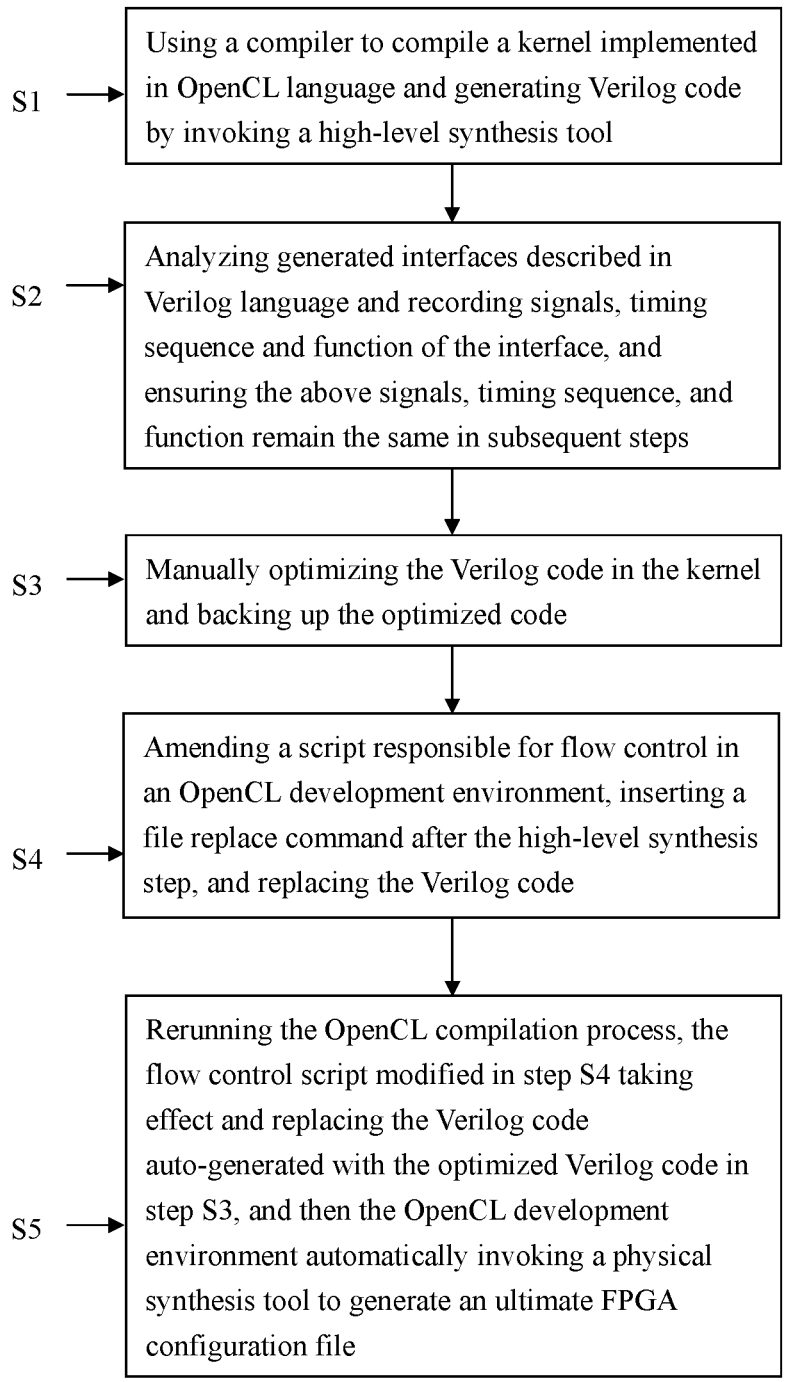
FIG. 1 shows a flow chart for steps of methods in this invention.
Figure 2:
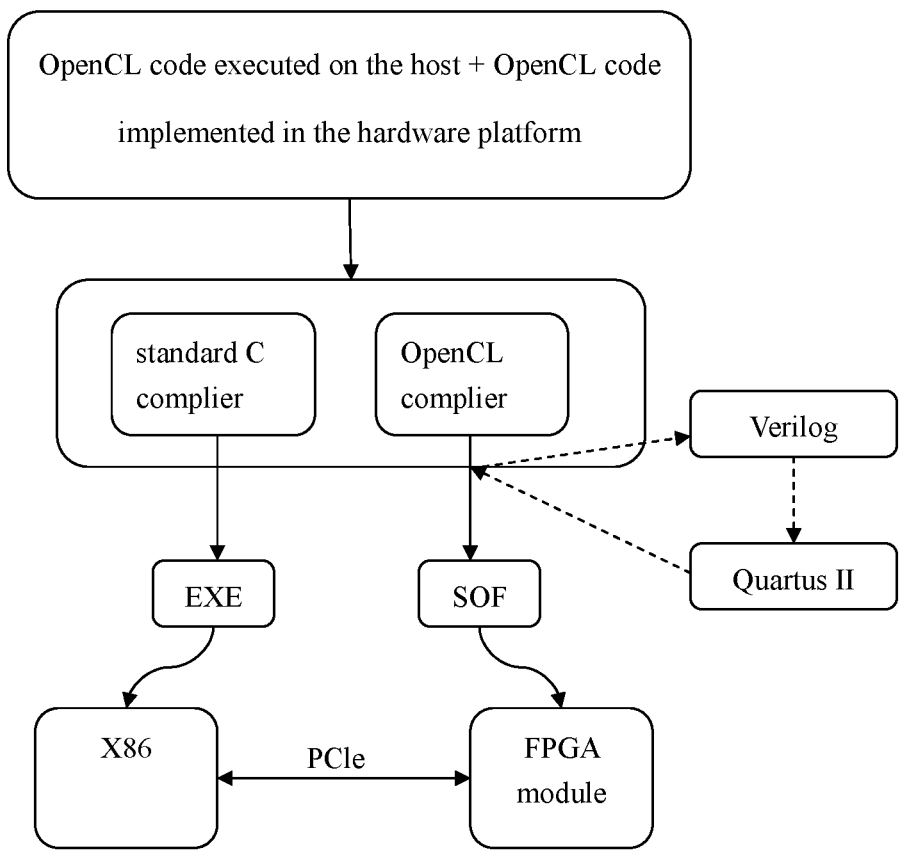
FIG. 2 shows a flow chart for a program development example in Altera SDK for OpenCL (AOCL) environment.

Based on the description above, a method for improving OpenCL hardware execution efficiency in the invention includes the following steps (as shown in FIG. 1):

S1: using a compiler to compile a kernel implemented in OpenCL language, and invoking a high-level synthesis tool to generate the Verilog code;

S2: analyzing generated interfaces described in Verilog language, recording signals, timing sequence, and function of the interfaces, and ensuring the above signals, timing sequence, and function remain the same in subsequent steps;

S3: manually optimizing the Verilog code in the kernel according to requirements of performance and resource utilization, and backing up the optimized code to avoid being covered by the subsequent steps;

S4: amending a script responsible for flow control in an OpenCL development environment, inserting a file replacement command after the high-level synthesis step in the compilation process, and replacing the Verilog code auto-generated by the compiler with the optimized Verilog code; and S5: rerunning the OpenCL compilation process from the beginning, the flow control script modified in step S4 taking effect and replacing the Verilog code auto-generated by the OpenCL compiler with the optimized Verilog code in step S3, then the OpenCL development environment automatically invoking a physical synthesis tool to finish the subsequent implementation, placement, and routing steps, and generating an ultimate FPGA configuration file.

The compiler in step S1 is provided by OpenCL development environment, such as Altera SDK for OpenCL or other similar tools. The common methods for manual optimization include promoting the working frequency, utilizing dedicated resources for critical paths, and inserting or deleting pipeline buffers, etc. For example, the working frequency of the auto-generated Verilog code can be improved by inserting buffers and increasing pipelines in the critical paths, to enhance the performance of the kernel. If the routing and timing results are poor, maybe too many FPGA resources are occupied. Under this condition, deleting redundancy logic in the auto-generated Verilog code or using substitutive resources to implement the same function will be helpful to retain the resource utilization in a reasonable level.

In detail, the content for manual optimization of the kernel may include recognizing parts of the auto-generated Verilog code possible to be modified and optimized, by parsing the compilation flow of the OpenCL development environment and analyzing the structure and interfaces of the auto-generated Verilog code; and performing targeted modifications, manual optimization, and partial or complete replacement to the Verilog code.

The content for parsing the compilation flow of OpenCL development environment and analyzing the structure and interfaces of auto-generated Verilog code mainly comprises the following steps of:

K1: analyzing the execution log of the original OpenCL compiling environment, which thoroughly records the running sequence of each step and detailed information about the compilation flow;

K2: probing the critical signals with hardware debugging tools, such as Signal Tap of Altera, to observe the underlying operations and reactions in the hardware platform when a specific command is launched in the host.

The above steps helps to understand the compilation process of OpenCL development environment and facilitates indicating the proper time for inserting a monitoring command and the file replacement command through the flow control script.

In further detail, amending the script responsible for flow control in OpenCL development environment includes inserting the monitoring command and the file replacement command; and replacing the Verilog code auto-generated by the compiler with the optimized code after detecting the high-level synthesis step in the compilation process is finished.

In step S2, the Verilog code generated from OpenCL code is basically similar in structure and interfaces, and therefore it's not necessary to analyze the information each time. This feature is the foundation of manual optimization for the auto-generated Verilog code and is concluded from numerous cases running in different OpenCL development environments.

Guaranteed that the signals, timing sequence and function of unified interfaces remain unchanged, the optimized code in a specific kernel can be seamlessly jointed with the auto-generated code. Targeted modifications, manual optimization, and partial or complete replacement can be carried out on a single or multiple kernels, and benefit the performance of the whole design. The invention preserves the complete OpenCL environment and compilation flows, and provides a method to improve the design quality and working efficiency of the OpenCL code mapping in the FPGA.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A method for improving OpenCL hardware execution efficiency, comprising the following steps:

S1: using a compiler to compile a kernel implemented in Open Computing Language (OpenCL), and invoking a high-level synthesis tool to generate Verilog code;

S2: analyzing generated interfaces described in Verilog language, recording signals, timing sequence, and function of the interfaces, and ensuring the recording signals, timing sequence, and function remain the same in subsequent steps;

S3: manually optimizing the Verilog code in the kernel according to requirements of performance and resource utilization, and backing up the optimized Verilog code to avoid being covered by the subsequent steps;

S4: amending a script responsible for flow control in an OpenCL development environment, inserting a file replacement command after the high-level synthesis step in the compilation process, and replacing the Verilog code generated by the compiler with the optimized Verilog code; and S5: rerunning the OpenCL compilation process from the beginning, the flow control script modified in step S4 taking effect and replacing the Verilog code auto-generated by the OpenCL compiler with the optimized Verilog code in step S3, then the OpenCL development environment automatically invoking a physical synthesis tool to finish the subsequent implementation, placement, and routing steps, and generating an ultimate FPGA configuration file.

2. The method for improving OpenCL hardware execution efficiency according to claim 1, wherein the step of manually optimizing the Verilog code in the kernel comprises:

recognizing parts of the Verilog code possible to be modified and optimized, by parsing the compilation flow of the OpenCL development environment and analyzing the structure and interfaces of the generated Verilog code; and performing targeted modifications, manual optimization, and partial or complete replacement to the Verilog code.

3. The method for improving OpenCL hardware execution efficiency according to claim 1, wherein the step of amending the script responsible for flow control in OpenCL development environment comprises:
   inserting a monitoring command and the file replacement command into the script; and
   replacing the Verilog code generated by the compiler with the optimized Verilog code after detecting the high-level synthesis step in the compilation process is finished.

* * * * *